United States Patent [19]

Sturrock et al.

[11] 4,103,168

[45] Jul. 25, 1978

[54] ELECTRON BEAM MICROFABRICATION APPARATUS

[75] Inventors: John Monro Sturrock, Cambridge; Bernard Allan Wallman, Harston, both of England

[73] Assignee: Cambridge Scientific Instruments Limited, England

[21] Appl. No.: 815,302

[22] Filed: Jul. 13, 1977

[30] Foreign Application Priority Data

Jul. 14, 1976 [GB] United Kingdom ............... 29204/76

[51] Int. Cl.$^2$ ............................................ G21K 5/06
[52] U.S. Cl. ................................. 250/442; 250/492 A
[58] Field of Search ............... 250/311, 397, 398, 440, 250/442, 492 A, 491

[56] References Cited

U.S. PATENT DOCUMENTS

| 3,648,048 | 3/1972 | Cahan et al. ...................... 250/492 A |
| 3,887,811 | 6/1975 | Livesay ............................. 250/492 A |
| 3,900,737 | 8/1975 | Collier et al. ..................... 250/492 A |

*Primary Examiner*—Alfred E. Smith
*Assistant Examiner*—B. C. Anderson

*Attorney, Agent, or Firm*—Oblon, Fisher, Spivak, McClelland & Maier

[57] ABSTRACT

Electron microscope apparatus for electron beam microfabrication. A mounting is described for supporting at least the final lens assembly of an electron microscope column above the vacuum chamber which also provides a rigid mounting for a stage on which a substrate is located together with reflecting mirrors which cooperate with a laser interferometer system for measuring the distances moved by the stage and therefore the substrate in two orthogonal directions.

To avoid unwanted movement between the mirrors and the interferometer heads, the latter are also carried by rigid support means on the underside of the mounting.

The mounting may comprise a solid ring located in an aperture in the lid of the vacuum chamber.

Alternatively, the mounting may comprise a rigid and reinforced plate forming the lid of the chamber, from the underside of which extend the rigid support means for the stage and interferometer heads. The laser is mounted on a rigid extension of the mounting overhanging the chamber so that alignment is always maintained between all parts of the laser interferometer system.

16 Claims, 4 Drawing Figures

ELECTRON BEAM MICROFABRICATION APPARATUS

FIELD OF INVENTION

This invention relates to electron beam apparatus particularly which is adapted for electron beam microfabrication.

BACKGROUND TO THE INVENTION

In electron beam microfabrication it is essential to be able to accurately locate fabricated detail on the surface of a substrate. Several techniques have been proposed which involve the precise measurement of the substrate position. This invention is concerned with the measurement of position using a laser interferometer. In such an arrangement a reflecting device for example a mirror or retroreflecting prism is mounted on the moveable member and the distance moved by the device determined with respect to a remote interferometer head. By arranging two such reflecting devices at right angles it is possible to monitor the position of a moveable member in two directions corresponding to the X and Y axes, using two appropriately positioned interferometer heads also at right angles to each other.

The accuracy of measurements which can be obtained using a laser interferometer techique is very great provided that there is no unwanted movement constituent parts of the optical system. Delfections and displacements of a few microns can be significant and the necessary rigidity is difficult to achieve when the moveable member has to be mounted in a highly evacuated enclosure such as a vacuum chamber of an electron microscope column.

OBJECT OF THE INVENTION

It is an object of the invention to provide a mounting for at least part of the electron optics of an electron microscope column and for a stage carrying a substrate and for one or more deflecting devices forming part of a laser interferometer measuring system for determining the distances through which the stage is moved. The improved mounting is to allow the high level of accuracy obtainable from laser interferometry measuring techniques to be obtained even when the stage is mounted in a highly evacuated enclosure such as the vacuum chamber at the lower end of an electron microscope column forming part of an apparatus for performing electron beam microfabrication.

THE INVENTION

According to the present invention apparatus for electron beam microfabrication in which a substrate is located on a stage below the final lens of an electron microscope column which includes the final lens at its lower end and in which the stge is moved relative thereto for exposing different fabricated detail on the surface of the substrate, comprises a mounting in the form of a rigid member having an aperture within which the final lens can be located; first rigid support means which extend downwardly from the rigid apertured member; a moveable stage and at least one reflecting device both of which are carried by the first rigid support means; second rigid support means for carrying remote interferometer means; and a laser source and receiver means which are mounted in alignment with the remote interferometer means, whereby at least the stage, the final lens the remote interferometer means and the reflecting device, form a unitary sub-assembly all the component parts of which are rigidly mounted with respect to the single rigid apertured member.

Preferably the laser source and receiver means are also carried by rigid support means which extend from the rigid apertured member.

The rigid apertured member may comprise a plate forming a lid for a vacuum chamber into which the first and second rigid support means extend.

Alternatively the rigid apertured member is an anular ring sealed in an aperture in a lid of a vacuum chamber into which the first and second support means extend. When assembled the rigid apertured member and final electron lens assembly form part of the lid of the vacuum chamber.

In either case the dimensions of the vacuum chamber must be such that nothing on the sub-assembly carried by the first and second rigid support means (which extend below the rigid apertured member) makes contact with any part of the interior of the vacuum chamber. In this way any distortion of the chamber during evacuation wil not result in mis-alignment of the electron optical lens and stage nor will it affect the alignment of the interferometer means and the reflecting device on the stage. Where the laser source and receiver means are also rigidly mounted relative to the rigid apertured member the alignment between these devices and the interferometer and reflecting device on the stage is also unaffected.

Preferably the horizontal centre line of the laser optics is placed exactly at the level of the work face of the substrate so that errors due to roll, pitch and yaw of the stage motions are minimized. In this way the laser inteferometer system records the actual movement of the work piece with respect to the electron optical column.

Where a connection is required between the assembly and the vacuum chamber for example to provide X and Y stage drives, the drive shafts may be fitted with couplings that are torsionally rigid but are flexible in all three planes.

It will be seen that the invention provides an advantage over previous proposals in that the alignment of the electron optics and the laser interferometer optics can be maintained at all times even when the sub-assembly (which may include the chamber lid) is removed from the vacuum chamber.

A ring shaped rigid apertured member preferably includes a circular aperture adapted to receive the final lens assembly of the electron microscope column and an outer annular flange which is adapted to be sealingly joined to the lid of the vacuum chamber.

Where the rigid apertured member is in the form of a ring, the lid of the vacuum chamber is preferably formed with a weakened region between the join with the ring and the walls of the chamber so that the central region of the lid containing the ring can flex readily relative to the outer region thereof which is in contact with the chamber wall.

Where the rigid apertured member is a plate forming the lid of a vacuum chamber it is preferably reinforced for example by intersecting ribs or webs typically in its upper surface.

Conveniently the laser source and receiver means are mounted on a common support member which is secured to the top surface of the rigid apertured member, whether the latter is an annular ring or forms the lid of the chamber, and extends laterally therefrom to overhang the side of the vacuum chamber when the rigid apertured member is fitted thereon.

The invention will now be described by way of example with reference to the accompanying drawings.

DETAILED DESCRIPTION OF DRAWINGS

Figure 1:
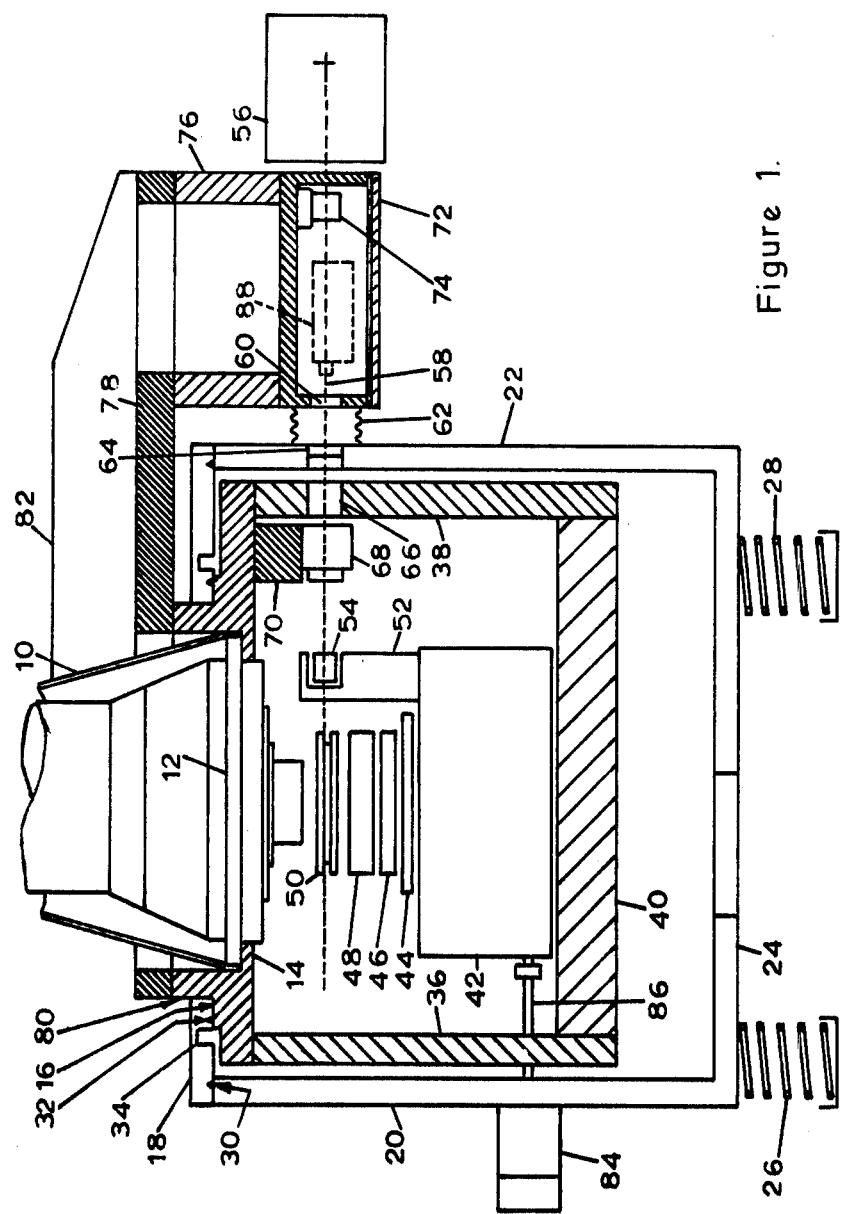
FIG. 1 is a cross section through part of an electron beam microfabrication apparatus embodying the invention.

As shown in FIG. 1 the lower end of an electron column 10 containing a final lens assembly generally designated 12 is supported on a radially inwardly directed flange 14 in an aperture within a massive ring generally designated 16. The ring forms an annular support for the final lens assembly 12, for the column 10 and for other components to be described later.

The ring 16 is attached to the underside of a plate 18 which comprises an apertured lid for a vacuum chamber having walls 20 and 22 and a base 24. To reduce vibration the base 24 is supported on springs 26 and 28.

A seal is formed between the underside of the apertured lid 18 and the upper edge of the walls 20, 22 by means of a first 0 ring seal 30 and in a similar way a seal is provided between the underside of the lid 18 and the ring 16 by means of a second 0 ring seal 32.

In order to provide for flexing between the inner region of the lid 18 and the outer region in contact with the walls, 20, 22 etc. an annular slot 34 is formed on the underside of the lid 18 so that a thin weakened wall section of the lid is left in the region of the annular slot 34 which allows the central region carrying the ring 16 to flex readily relative to the outer region of the lid 18.

Struts 36 and 38 extend from the underside of the ring 16 and carry a solid base plate 40. The base 40 extends parallel to the plane of the ring 16 and together with the struts 36 and 38 is freely supported within the chamber formed by the lid 18 the walls 20, 22 and the base 24. In this way any distortion of the vacuum chamber lid or walls or base during or as a result of evacuation will not produce any change in the relative position of the base plate 40 relative to the ring 16 even though the ring 16 may itself move relative to the chamber due to flexing of the lid 18.

While the struts 36 and 38 are made as rigid as is convenient it is to be understood that provided the link between the interferometer heads and electron optical column is rigid the laser system will still monitor the absolute movement of the workpiece with respect to the electron optical column including any flexure of the stage mounting struts 36 and 38. A small degree of flexure of these struts caused for example by a reaction between the stage drives (to be described) and the chamber wall or due to variation of the position of the centre of gravity of the stage (to be described) as it moves over its baseplate, is therefore permissible.

The baseplate 40 carries a stage generally designated 42 which is capable of producing X and Y co-ordinate movements in a plane parallel to the plane of the ring 16. Carried on the stage 42 is a superplate 44, a θ table 46, a chuck holder 48 and a work piece chuck 50. Also carried on the stage is a mirror support 52 carrying a plane mirror 54.

Although only one mirror is shown in the drawing in fact two mirrors are provided on the stage one for registering movements in the X co-ordinate direction and the other for registering movements in the Y co-ordinate direction.

The mirrors serve to reflect a concentrated beam of light from a laser source 56 the beam being denoted by the dotted line 58.

The beam passes through a window 60 and a flexible light tight joint 62 to enter through a further window 64 into the chamber. A further window 66 is provided in the strut 38 and the beam passes through an interferometer head 68 to impinge on the mirror 54. The reflected beam from the mirror 54 is again picked up by the interferometer head 68 and is transmitted to a receiver shown in dotted outline 88.

A second interferometer head (not shown) is provided for the second mirror (not shown) as will be described hereinafter, in relation to FIG. 2. Both interferometer heads are rigidly supported by the rings 16 by means of rigid supports one of which is shown at 70.

It will be seen in FIG. 1 the final lens and the stage on which the substrate is supported are both carried by a single member namely the ring 16 as also are the interferometer heads such as 68 so that no relative movement can occur between a head 68 and the stage 26 (or more particularly the mirror 54 carried by the stage) other than movement caused by the X and Y movement of the stage. Distortion of the vacuum chamber walls or lid has no effect on the relative positions of the interferometer heads and mirrors.

Substrates are changed through a porthole (not shown) in the chamber wall 20 or 22. Further portholes are also provided for routine servicing of the stage drives where these are provided and for adjustment of the alignment of the interferometer heads. The lid need only therefore be removed for servicing and for relapping the stage slideways and like operations.

To preserve alignment between the laser source 56 and the interferometer heads such as 68 the laser source 56 and related optical guide 72 (containing where required a laser beam bender 74), are carried at the lower end of a support 76 carried on the underside of an overhanging plate 78 which is firmly attached to a central annular protrusion 80 of the ring 16. In this way it will be seen that alignment of the laser interferometer optics can be maintained provided the plate 78 remains attached to the ring 16 even though the ring and/or lid is removed completely from the vacuum chamber.

Reinforcing ribs are preferably provided as denoted by reference numeral 82 to render the support plate 78 as rigid as possible to prevent bending or vibration.

Where the stage 42 is driven externally the drive is preferably provided by means of stepping motors one of which is shown at 84. Drive is transmitted via flexible drive shafts one of which is shown at 86.

Figure 2:
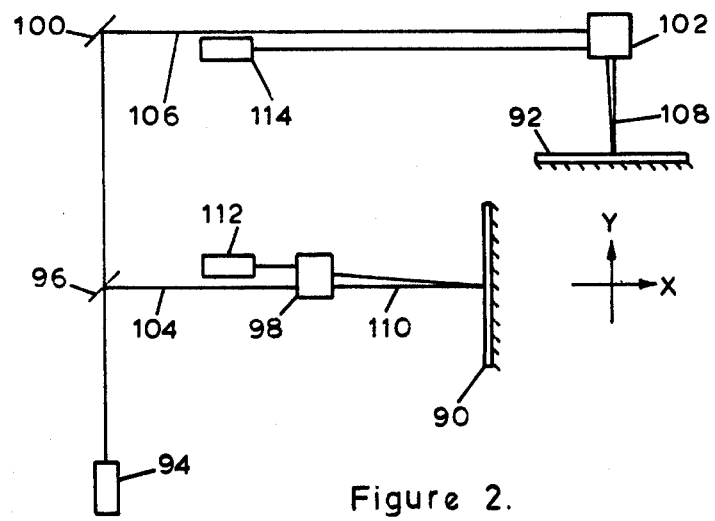
FIG. 2 illustrates a laser and interferometer layout employed to perform accurate measurements in two orthogonal directions.

FIG. 2 illustrates diagramatically the optics of the laser interferometer. Two mirrors 90 and 92 are shown at right angles mounted on a stage (not shown) which is capable of movement in two orthogonal directions denoted by the arrows X and Y.

Light from the laser source 94 is reflected by a 50% reflecting mirror or prism 96 into a first interferometer head 98 and via a totally reflecting mirror 100 into a second interferometer head 102. The latter is associated with or includes a beam bending device (not shown) so that while the beam 104 which passes to the first interferometer head 98 passes straight on to the mirror 90 the second beam 106 from the mirror 100 is bent through a right angle to emerge from the head 102 as the beam 108.

The beam 108 from the interferometer head 102 and the beam 110 from the interferometer head 98 impinge on the two mirrors 92 and 90 respectively and are reflected back towards the interferometer heads. After passing through the heads the two beams are received by a pair of receivers, 112 for head 98 and 114 for head 102.

It will be seen that movement of the stage in the X direction will not alter the path length between the mirror 92 and the interferometer head 102 but will alter the path length between the interferometer head 98 and the mirror 90.

Movement of the stage in the Y direction will produce the converse i.e., variation of the path length between head 102 and mirror 92 but not between head 98 and mirror 90.

It will be appreciated that additional reflecting surfaces or prisms etc. may be provided to allow a different layer to the various component parts of the system.

Figure 3:
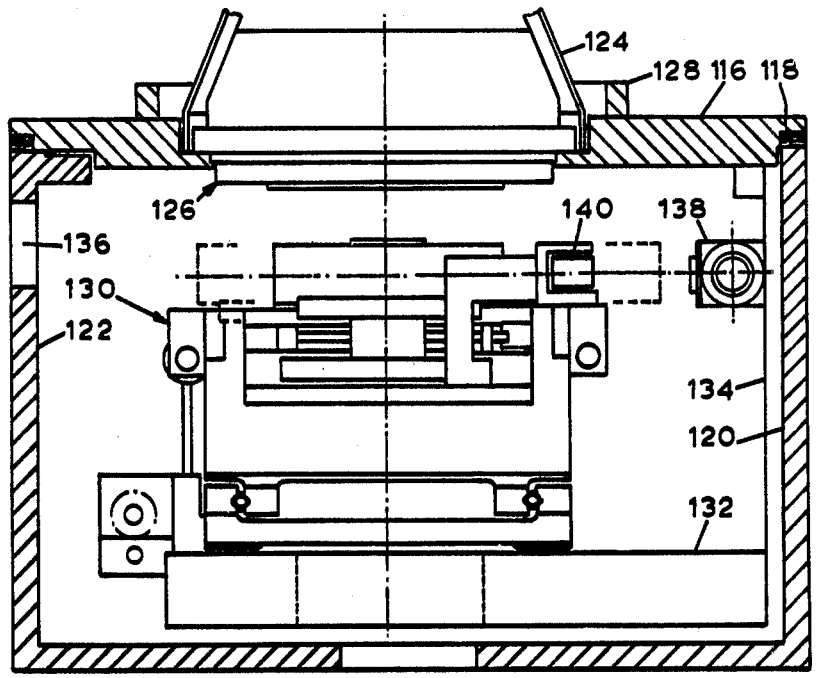
FIG. 3 is a cross section through an alernative embodiment of the invention in which the rigid appertured member of the invention is a lid for a vacuum chamber.

A further embodiment of the invention is shown in FIG. 3 in which the ring is integrally formed with the lid to the vacuum chamber. To this end a rigid lid 116 is adapted to be sealed by means of an O ring seal 118 to the upper edges of the chamber walls 120, 122 and includes centrally an aperture within which the lower end 124 of an electron microscope column is received together with the final lens assembly generally designated 126. Around the aperture is formed a reinforcing rib 128 to strengthen the plate 116 forming the lid and although not shown further ribs may be provided to provide additional strengthening.

Deflection of the lid can occur during evacuation of the chamber but the working distance between the lower end of the final lens assembly and the substrate (not shown) mounted on the stage which is generally designated 130, remains constant since the stage is mounted on a platform 132 which is supported by means of rigid struts (one of which is shown at 134) which depend from and are secured to the underside of the lid 116.

A porthole 136 allows a laser beam from a laser source (not shown) to enter the chamber for passing through an interferometer head 138 to be reflected by a mirror 140 mounted to the stage.

In order to maintain alignment and to reduce relative movement between the mirror 140 and the head 138 the latter is carried by one or more of the struts 134 so that the struts comprise both first and second rigid support means. Alternatively an additional strut (not shown) may be provided from the underside of the plate 116 on which the interferometer head 138 is mounted.

An additional mirror (not shown) and interferometer head (not shown) is provided for registering movement of the stage 130 about an orthogonal axis.

Where the lid 116 is sufficiently rigid so as to allow the arrangement shown in FIG. 3, the laser source (not shown) and receivers (not shown) may be mounted either as shown in FIG. 1 on an overhanging strut secured to the lid 116 or may be secured directly to the wall of the chamber 122 or 120.

Figure 4:
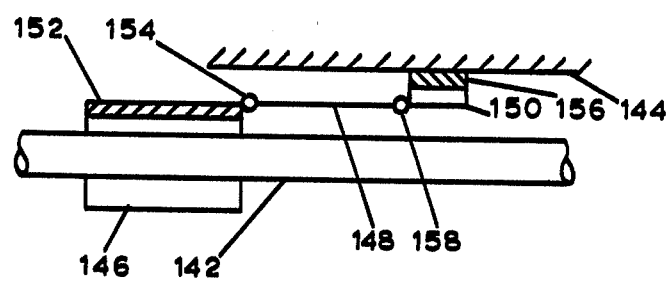
FIG. 4 is a detail of a preferred driving link between an X and Y axis drive and the moveable member of the stage.

FIG. 4 shows a preferred driving link for transmitting drive between an X or Y drive shaft 142 and the moveable member of the stage (which may be the stage shown in either FIG. 1 or FIG. 3) and generally designated 144 in FIG. 4. The drive shaft 142 is rotated so that sleeve 146 carried thereon is caused to traverse in a linear direction parallel to the axis of the shaft 142 in one direction or the other depending on the direction of rotation of the shaft. The movement of the sleeve on the shaft can cause vibration and even distortion of the stage member 144 and to this end a leaf spring 148 is located between the sleeve 146 and an abutment 150 on the underside of the member 144. The leaf spring is pivotally attached to the sleeve 146 and to the abutment 160.

The leaf spring 148 is chosen so as to be rigid and inextensible in so far as its length is concerned but to be capable of flexing and pivoting between the sleeve 146 and abutment 150 to accommodate any movement of the sleeve and the drive in a generally vertical direction so that any such movement is not transmitted to the member 144. On the other hand axial movement of the sleeve 146 will be transmitted via the spring 148 to the member 144, the leaf spring 148 either being in tension when the sleeve 146 is moving to the left as shown in FIG. 4 or acting as a rigid thrust member when the sleeve 146 is moving to the right in FIG. 4.

Further distortion can occur as a result of expansion of the moveable member of the stage and to this end thermal insulation is preferably provided between the sleeve 146 and the member 144. This conveniently takes the form of a washer or sleeve or sandwich of thermal insulating material such as 152 between the sleeve 146 and the pivotal joint 154 and/or a similar washer or sleeve or layer of thermal insulation material 156 between the member 144 and the abutment 150 as shown or between the abutment 150 and the pivotal joint 158 (not shown).

We claim

1. Apparatus for electron beam microfabrication in which a substrate is located on a stage below the final lens of an electron microscope column which includes the final lens at its lower end and in which the stage is moved relative thereto for exposing different fabricated detail on the surface of the substrate comprising:
    (a) a mounting in the form of a rigid member having an aperture within which the final lens can be located,
    (b) first rigid support means which extends downwardly from the rigid apertured member,
    (c) a moveable stage,
    (d) at least one reflecting device, both the moveable stage and the reflecting device being carried by the first rigid support means,
    (e) second rigid support means for carrying remote interferometer means,
    (f) a laser source and receiver means which are mounted in alignment with the remote interferometer means whereby at least the stage, the final lens, the remote interferometer means and the reflecting device form a unitary sub-assembly all the component parts of which are rigidly mounted with respect to the single rigid apertured member.

2. Apparatus as set forth in claim 1 further comprising third rigid support means which extend from the rigid apertured member and to which the laser source and receiver means are attached.

3. Apparatus as set forth in claim 1 wherein the rigid apertured member comprises a plate forming a lid for a vacuum chamber into which the first and second rigid support means extend.

4. Apparatus as set forth in claim 1 wherein the rigid apertured member is an annular ring which is adapted to be sealed into an aperture in a lid of a vacuum chamber into which the first and second support means extend.

5. Apparatus as set forth in claim 1 wherein the optical axis of the laser interferometer system is horizontal and is located at the level of the workface of the substrate so that errors due to roll, pitch and yaw of the stage motions are minimized.

6. Apparatus as set forth in claim 1 further comprising a connection between a drive means and the stage to provide one of the said X and Y stage drives and flexible drive shaft connecting the drive means to the stage.

7. Apparatus as set forth in claim 6 further comprising couplings in said flexible drive which ae torsionally rigid but are flexible in all three planes.

8. Apparatus as set forth in claim 1 wherein the rigid apertured member comprises an annular member having a circular aperture adapted to receive the final lens assembly of the electron microscope column and further comprising an outer annular flange which is adapted to be sealingly joined to the lid of the vacuum chamber.

9. Apparatus as set forth in claim 8 wherein the lid of the vacuum chamber is formed with a weakened region between the join with the ring and the chamber walls so that the central region of the lid containing the ring can flex readily relative to the outer region thereof which is in contact with the chamber wall.

10. Apparatus as set forth in claim 3 wherein the lid further comprises reinforcing means for strengthening the lid.

11. Apparatus as set forth in claim 10 wherein the reinforcing means comprises intersecting ribs or webs on the upper surface of the lid.

12. Apparatus as set forth in claim 1 further comprising a common support member which is secured to the top surface of the rigid apertured member and overhangs the chamber wall to provide a rigid support for the laser source and receiver.

13. Apparatus as set forth in claim 1 wherein the said first and second rigid support means are formed integrally.

14. Apparatus as set forth in claim 1 wherein the said moveable stage comprises a moveable platform and a stationary support therefor, drive means for moving the platform relative to the support in at least one direction and a link between the drive means and the platform which transmits drive between the drive means and the platform in the said one direction but allows free relative movement between the platform and the said drive means in at least a direction perpendicular to the said one direction to accomodate vibratory and torsional disturbances introduced by the drive means.

15. Apparatus as set forth in claim 1 wherein the moveable stage comprises a moveable platform, a stationary support therefor and drive means for moving the platform relative to the support and further comprising a link between the drive means and the platform, said link comprising a thermally insulating member whereby heat generated by the said drive means is prevented from reaching the moveable platform.

16. Apparatus as set forth in claim 1 wherein the chamber walls include aperture means to give access to the interior of the chamber and aperture closure means for sealing the aperture means to allow the interior of the chamber to be evacuated.

* * * * *